(12) United States Patent
Zhan et al.

(10) Patent No.: US 10,760,929 B2
(45) Date of Patent: *Sep. 1, 2020

(54) ENVIRONMENTAL SENSOR AND MANUFACTURING METHOD THEREOF

(71) Applicant: Weifang Goertek Microelectronics Co., Ltd., Weifang, Shandong Province (CN)

(72) Inventors: Junkai Zhan, Shandong (CN); Mengjin Cai, Shandong (CN)

(73) Assignee: Weifang Goertek Microelectronics Co., Ltd., Weifang, Shandong Province (CN)

( * ) Notice: Subject to any disclaimer, the term of this patent is extended or adjusted under 35 U.S.C. 154(b) by 63 days.

This patent is subject to a terminal disclaimer.

(21) Appl. No.: 15/781,352

(22) PCT Filed: Dec. 14, 2015

(86) PCT No.: PCT/CN2015/097317
§ 371 (c)(1),
(2) Date: Jun. 4, 2018

(87) PCT Pub. No.: WO2017/092075
PCT Pub. Date: Jun. 8, 2017

(65) Prior Publication Data
US 2018/0356255 A1    Dec. 13, 2018

(30) Foreign Application Priority Data
Dec. 4, 2015 (CN) .......................... 2015 1 0890382

(51) Int. Cl.
*G01D 5/241* (2006.01)
*G01K 7/34* (2006.01)
(Continued)

(52) U.S. Cl.
CPC ....... *G01D 5/2417* (2013.01); *B81C 1/00182* (2013.01); *B81C 1/00214* (2013.01);
(Continued)

(58) Field of Classification Search
CPC ........ G01D 5/241; G01D 5/2417; G01K 7/34; G01L 9/00; G01L 9/0047; G01L 9/0045;
(Continued)

(56) References Cited

U.S. PATENT DOCUMENTS

| 2001/0020320 A1 | 9/2001 | Mcintosh et al. |
| 2006/0131691 A1 | 6/2006 | Roozeboom et al. |

(Continued)

FOREIGN PATENT DOCUMENTS

| CN | 1809919 A | 7/2006 |
| CN | 101183690 A | 5/2008 |

(Continued)

OTHER PUBLICATIONS

International Searching Authority, International Search Report (ISR) and Written Opinion for International Application No. PCT/CN2015/097317, dated Aug. 31, 2016, 10 pages, State Intellectual Property Office of the P.R.C., China.

(Continued)

*Primary Examiner* — Son T Le
(74) *Attorney, Agent, or Firm* — Alston & Bird LLP

(57) ABSTRACT

An environmental sensor and manufacturing method thereof. The environmental sensor comprises: a substrate comprising at least one recess disposed at an upper portion of the substrate; and a sensitive film layer disposed above the substrate, comprising a fixed portion fixed on an end surface of the substrate and a bent portion configured to extend inside the recess. The bent portion and a side wall of the recess form a capacitor configured to detect a signal. The bent portion, fixed portion, and the recess form a closed (Continued)

cavity. A conventional capacitive structure configured on a substrate surface is changed to a capacitive structure of the environmental sensor vertically extending into the inside of the substrate, increasing a depth of the recess, and in turn, increasing a sensing area between two polar plates of the capacitor, significantly shrinking a coverage area of the capacitor on the substrate, and satisfying a requirement of a modern compact electronic component.

14 Claims, 5 Drawing Sheets

(51) Int. Cl.
*G01L 9/00* (2006.01)
*B81C 1/00* (2006.01)

(52) U.S. Cl.
CPC .............. *G01K 7/34* (2013.01); *G01L 9/0045* (2013.01); *G01L 9/0047* (2013.01); *G01L 9/0073* (2013.01); *B81B 2201/0214* (2013.01); *B81B 2201/0221* (2013.01); *B81B 2201/0264* (2013.01); *B81B 2201/0278* (2013.01); *B81B 2207/053* (2013.01)

(58) Field of Classification Search
CPC ..... G01L 9/0073; B81C 1/00; B81C 1/00182; B81C 1/00214; B81B 2201/0214; B81B 2201/0264; B81B 2201/0257; B81B 2201/0278; B81B 2207/053; B81B 2201/0221; H04R 19/04; H04R 2201/003; H04R 2201/005; H04R 31/00
See application file for complete search history.

(56) References Cited

U.S. PATENT DOCUMENTS

| | | |
|---|---|---|
| 2010/0181645 A1 | 7/2010 | Marenco |
| 2013/0063163 A1 | 3/2013 | Sim et al. |
| 2014/0057444 A1 | 2/2014 | Murakami |
| 2015/0377919 A1 | 12/2015 | Yoda |

FOREIGN PATENT DOCUMENTS

| | | | |
|---|---|---|---|
| CN | 101636826 A | 1/2010 | |
| CN | 102955045 A | 3/2013 | |
| CN | 202770456 U | 3/2013 | |
| CN | 103508412 A | 1/2014 | |
| CN | 104897334 A | 9/2015 | |
| CN | 105036054 A | 11/2015 | |
| CN | 205175427 U | 4/2016 | |
| JP | 2012195442 A | 10/2012 | |
| JP | 6393930 B2 * | 9/2018 | .......... B41J 2/14209 |

OTHER PUBLICATIONS

International Searching Authority, Written Opinion for International Application No. PCT/CN2015/097317, dated Aug. 31, 2016, 4 pages, State Intellectual Property Office of the P.R.C., China.
State Intellectual Property Office of the P.R.C., First Office Action, including Search Report, for Application No. 201510890382.4, dated Apr. 5, 2017, 9 pages, China.
State Intellectual Property Office of the P.R.C., Notification to Grant Patent for Application No. 201510890382.4, dated May 25, 2017, 3 pages, China.
State Intellectual Property Office of the P.R.C., Supplementary Search Report for Application No. 201510890382.4, dated Apr. 21, 2017, 1 pages, China.

* cited by examiner

ENVIRONMENTAL SENSOR AND MANUFACTURING METHOD THEREOF

CROSS-REFERENCE TO RELATED APPLICATIONS

This application is a National Stage of International Application No. PCT/CN2015/097317, filed on Dec. 14, 2015, which claims priority to Chinese Patent Application No. 201510890382.4, filed on Dec. 4, 2015, both of which are hereby incorporated by reference in their entireties.

BACKGROUND

Technical Field

The present invention relates to the field of sensors, and more particularly, to an environmental sensor for measurement. The present invention further relates to a manufacturing method for an environmental sensor.

Related Art

In recent years, with the development of science and technology, the sizes of electronic products such as mobile phones and laptops are continuously reduced. Besides, the requirements of people on the performance of these portable electronic products are also higher and higher, which requires that the sizes of matched electronic parts must be reduced accordingly.

As measuring devices, the sensors have been applied to the electronic products such as the mobile phones and the laptops generally. In the existing technological structures, two conductive film layers are deposited on the surface of a base material in the manner of semiconductor processing generally. These two conductive film layers form a parallel capacitance structure. When the outside environment is changed, the distance or opposite area between the two conductive film layers is changed. Therefore, the parallel capacitance structure can output a corresponding detection electric signal. The capacitance structure in parallel arrangement occupies a larger space, which does not conform to the modern development requirements.

BRIEF SUMMARY

An objective of the present invention is to provide a novel technical solution of an environmental sensor.

According to the first aspect of the present invention, there is provided a environmental sensor, comprising a base material. The upper end of the base material is provided with at least one groove. The environmental sensor further comprises a sensitive film layer on the base material. The sensitive film layer comprises a fixed part fixed on the end surface of the base material and a bending part extending into the groove. The bending part and the side wall of the groove form a capacitor configured for signal detection. The bending part, the fixed part and the groove form an airtight cavity.

Preferably, the bending part is suspended in the groove.

Preferably, the bottom end of the bending part is fixed on the bottom end of the groove by a first sacrificial layer.

Preferably, the sensitive film layer further comprises a connecting part connected to two adjacent bending parts. The connecting part is suspended above the end surface of the base material.

Preferably, the connecting part is further provided with a hollow. The two adjacent bending parts are insulated by the hollow. The environmental sensor further comprises a second sacrificial layer filling the hollow.

The present invention further provides an environmental sensor, comprising a base material. The upper end of the base material is provided with at least one groove. The environmental sensor further comprises a fixed film layer at least disposed on the side wall of the groove of the base material by an insulating layer. The environmental sensor further comprises a sensitive film layer on the base material. The sensitive film layer comprises a fixed part fixed on the end surface of the base material and a bending part extending into the groove. The bending part and the side wall of the fixed film layer form a capacitor configured for signal detection. The bending part, the fixed part and the groove form an airtight cavity.

The present invention further provides a manufacturing method for an environmental sensor, which comprises the following steps.

a) A groove is etched in the upper end surface of a base material, and a first sacrificial layer is deposited on the upper end surface of the base material and the inner wall of the groove.

b) A sensitive film layer is deposited on the first sacrificial layer. The sensitive film layer comprises a fixed part fixed on an end surface of the base material and a bending part extending into the groove.

c) The sensitive film layer on the end surface of the base material is etched to form a hollow.

d) The first sacrificial layer located between the bending part and the side wall of the groove is at least corroded by the hollow.

e) A second sacrificial layer is deposited on the sensitive film layer, and the second sacrificial layer seals the hollow.

f) The second sacrificial layer located on the bending part is corroded.

Preferably, between the step e) and the step f), the manufacturing method further comprises the following step: etching the positions on the second sacrificial layer on both sides of the hollow to form a side wall groove, and depositing a protective layer on the upper end of the second sacrificial layer, wherein the protective layer is filled in the side wall groove.

Preferably, in the step d), the first sacrificial layer between the bending part and the groove is completely corroded, such that the bending part is suspended in the groove.

Preferably, before the first sacrificial layer is deposited in the step a), the manufacturing method further comprises the step of depositing a third sacrificial layer and a fixed film layer on the inner wall of the groove in sequence.

According to the environmental sensor of the present invention, the bending part of the sensitive film layer and the side wall of the groove form a vertical capacitor structure. When the outside environment is changed (for example, the pressure is changed), the bending part will be deformed accordingly. Therefore, the distance between the bending part and the side wall of the groove can be changed, and the signal output by the capacitor is caused to be changed. According to the environmental sensor of the present invention, the capacitor structure traditionally disposed on the surface of the base material is changed into the capacitor structure vertically extending into the base material. The sensing area between two electrode plates of the capacitor can be increased by increasing the depth of the groove. Therefore, the coverage area of the capacitor on the base material can be greatly reduced, and the development trend of becoming lighter and thinner of modern electronic devices is met.

The inventors of the preset invention found in the prior art that since the sensor is on the surface of the base material, lots of chip areas are occupied, which is unfavorable for the miniaturization development of the sensor. Therefore, the technical task to be achieved by the present invention or the technical problem to be solved by the present invention is not conceived or anticipated by those skilled in the art, and accordingly, the present invention is a novel technical solution.

Other features and advantages of the present invention will become apparent through the detailed descriptions of the exemplary embodiments of the present invention with reference to the drawings.

BRIEF DESCRIPTION OF THE FIGURES

The drawings that constitute a part of the description show the embodiments of the present invention and are intended to explain the principle of the present invention together with the descriptions thereof.

DETAILED DESCRIPTION OF VARIOUS EMBODIMENTS

Now, various exemplary embodiments of the present invention will be described in detail with reference to the drawings. It should be noted that, unless specified otherwise, the relative arrangements of the members and steps, the mathematical formulas and numerical values described in these embodiments do not restrict the scope of the present invention.

The following descriptions for at least one embodiment are actually descriptive only, and shall not be intended to limit the invention and any application or use thereof.

The techniques and devices well known to those skilled in the related arts may not be discussed in detail. However, where applicable, such techniques and devices should be deemed as a part of the description.

Any specific value shown herein and in all the examples should be interpreted as only rather than restrictive. Therefore, other examples of the exemplary embodiments may include different values.

It should be noted that similar signs and letters in the following drawings represent similar items. Therefore, once defined in one drawing, an item may not be further discussed in the followed drawings.

Figure 1:
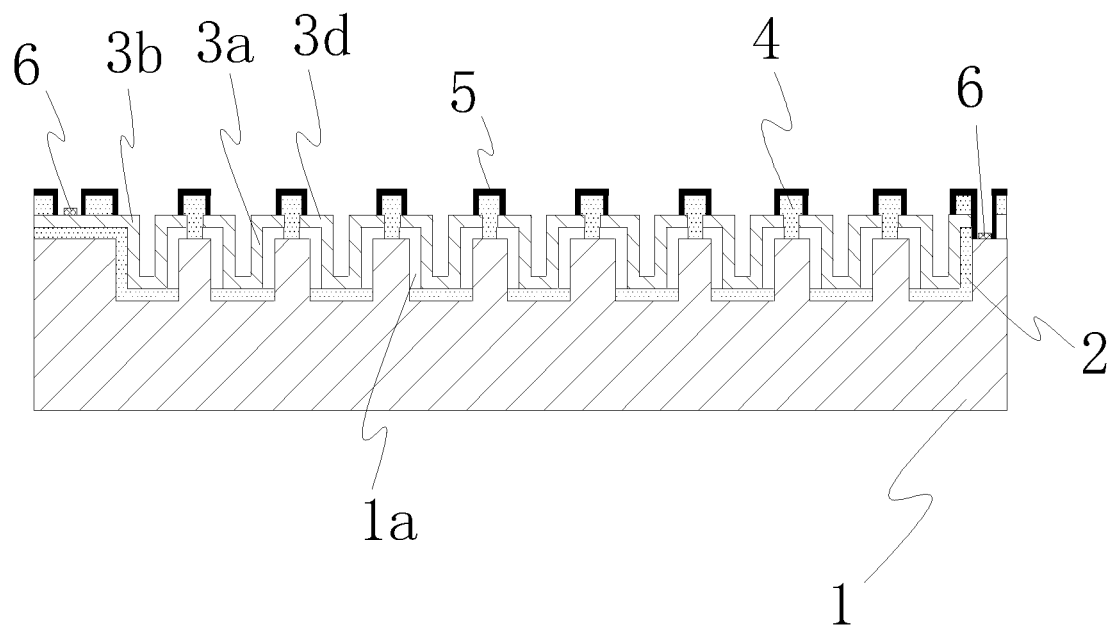
FIG. 1 is a structural schematic diagram of an environmental sensor according to the present invention.

Referring to FIG. 1, the present invention provides an environmental sensor, which may be a sensor for detecting the surrounding environment, such as a pressure sensor, a temperature sensor and a humidity sensor. The environmental sensor comprises a base material 1. The upper end surface of the base material 1 is provided with at least one groove 1a. The amount of the groove 1a can be set according to actual structural needs. The shape of the groove 1a may be a U-shaped groove structure, and may also be an arc groove structure or the like well known by those skilled in the art.

The environmental sensor according to the present invention further comprises a sensitive film layer 3 on the base material 1. The sensitive film layer 3 comprises a fixed part 3b fixed on the end surface of the base material 1 and a bending part 3a extending into the groove 1a. The bending part 3a and the side wall of the groove 1a form a capacitor structure configured to detect the surrounding environment. Specifically, the sensitive film layer 3 may adopt a polycrystalline silicon material and may be disposed on the base material 1 in a manner of depositing or the like. A first sacrificial layer 2 may be disposed between the fixed part 3b and the base material 1. It should be noted here that the sacrificial layer may adopt a material well known by those skilled in the art, such as silicon oxide. The sacrificial layer may also be used as an insulating layer to ensure insulation among the parts, which belongs to common general knowledge of those skilled in the art in the art and is not explained specifically here. Due to the first sacrificial layer 2, the fixed part 3b and the base material 1 are insulated from each other. Meanwhile, the first sacrificial layer 2 may support the sensitive film layer 3 on the base material 1, to prevent the bending part 3a in the sensitive film layer 3 from making contact with the base material 1.

The bending part 3a is matched with the shape of the groove 1a. For example, when the groove 1a is a U-shaped structure, the bending part 3a may select a U-shaped groove structure, and may also select the arc groove structure well known by those skilled in the art. The bending part 3a is smaller than the groove 1a, such that the bending part 3a can extend into the 1a. The bending part 3a, the fixed part 3b and the groove 1a form an airtight cavity together.

According to the environmental sensor of the present invention, the bending part 3a of the sensitive film layer and the side wall of the groove 1a form a vertical capacitor structure. When the outside environment is changed (for example, the pressure is changed), the bending part 3a will be deformed accordingly, thereby changing the distance between the bending part 3a and the side wall of the groove 1a, and causing a signal output by the capacitor to be changed. The environmental sensor according to the present invention may be strip-shaped, comb tooth-shaped or spiral or other shapes well known by those skilled in the art. The capacitor structure traditionally disposed on the surface of the base material is changed into the capacitor structure vertically extending into the base material. The sensing area between two electrode plates of the capacitor can be increased by increasing the depth of the groove. Therefore, the coverage area of the capacitor on the base material can be greatly reduced. The coverage area of the environmental sensor according to the present invention can be reduced to $\frac{1}{5}$-$\frac{1}{10}$ of the coverage area of the traditional sensor, or smaller, which meets the development trend of becoming lighter and thinner of modern electronic devices.

In a preferred embodiment of the present invention, the bending part 3a of the sensitive film layer is suspended in the groove 1a of the base material. That is to say, there is no any connection relationship between the bending part 3a and the groove 1a. When the outside environment is changed, the bending part 3a will be deformed accordingly, thereby changing the distance between the bending part 3a and the side wall of the groove 1a, and causing the signal output by the capacitor to be changed.

In another preferred embodiment of the present invention, the bending part 3a of the sensitive film layer extends into the groove 1a of the base material, and the bottom end of the bending part 3a and the bottom end of the groove 1a are connected together by a second sacrificial layer 4. That is to say, the bottom end of the bending part 3a is fixed by the second sacrificial layer 4. When the outside environment is changed, the bottom end of the bending part 3a is fixed, thereby preventing the bending part 3a from swinging in the groove 1a. Only the side wall of the bending part 3a is deformed along with the change of the outside environment. Therefore, the distance between the bending part 3a and the side wall of the groove 1a is changed, and the signal output by the capacitor is caused to be changed.

In one preferred embodiment of the present invention, when a plurality of grooves 1a is disposed, the fixed part 3b may be disposed on the edge position of each groove 1a, and may also be disposed only on the edge of the outermost groove 1a. When the fixed part 3b is disposed only on the edge of the outermost groove 1a, the sensitive film layer 3 further comprises a connecting part 3d connected to two adjacent bending parts 3a, referring to FIG. 1. The connecting parts 3d are suspended above the end surface of the base material preferably. At this point, the bending parts 3a and the connecting parts 3d make no contact with the base material 1, that is to say, the bending parts 3a and the connecting parts 3d are all in the suspending state. Therefore, the sensitivity of the bending parts 3a is improved, and a finally detected result becomes more precise.

Figure 5:
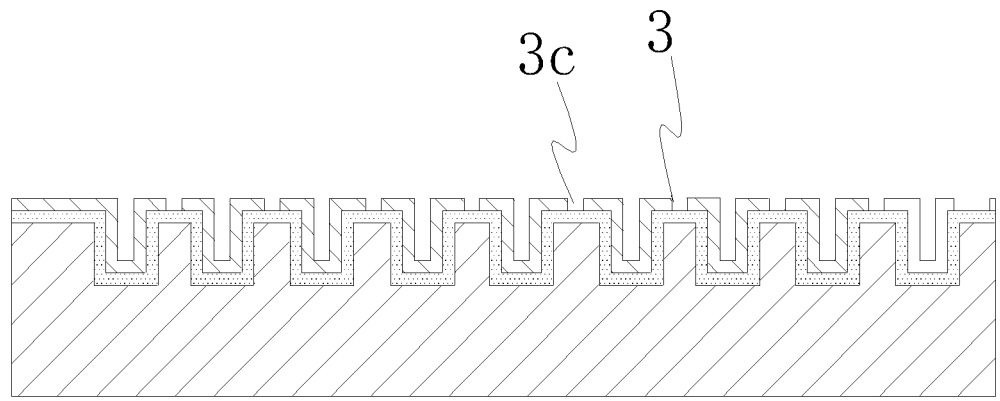
Figure 7:
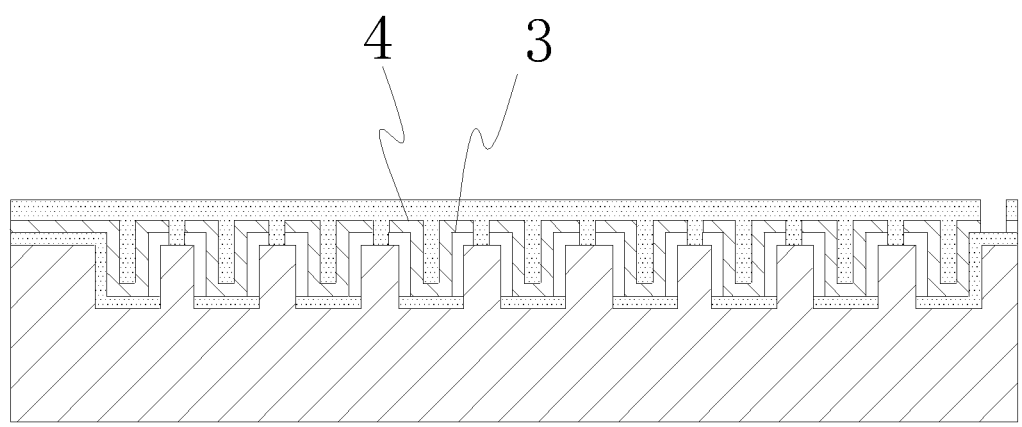

According to the environmental sensor of the present invention, a plurality of groups of capacitor structures may be disposed according to actual needs, and it is required to dispose hollows 3c on some connecting parts 3d, referring to FIG. 5. The two adjacent bending parts 3a are insulated by the hollow 3c. Meanwhile, in order to ensure that the environmental sensor has the airtight cavity, the hollows 3c are required to be filled with a second sacrificial layer 4, referring to FIG. 7. According to the present invention, further preferably, the upper end of the second sacrificial layer may be provided with a protective layer 5. By the protective layer 5, water or mist can be prevented from entering the environmental sensor.

Figure 11:
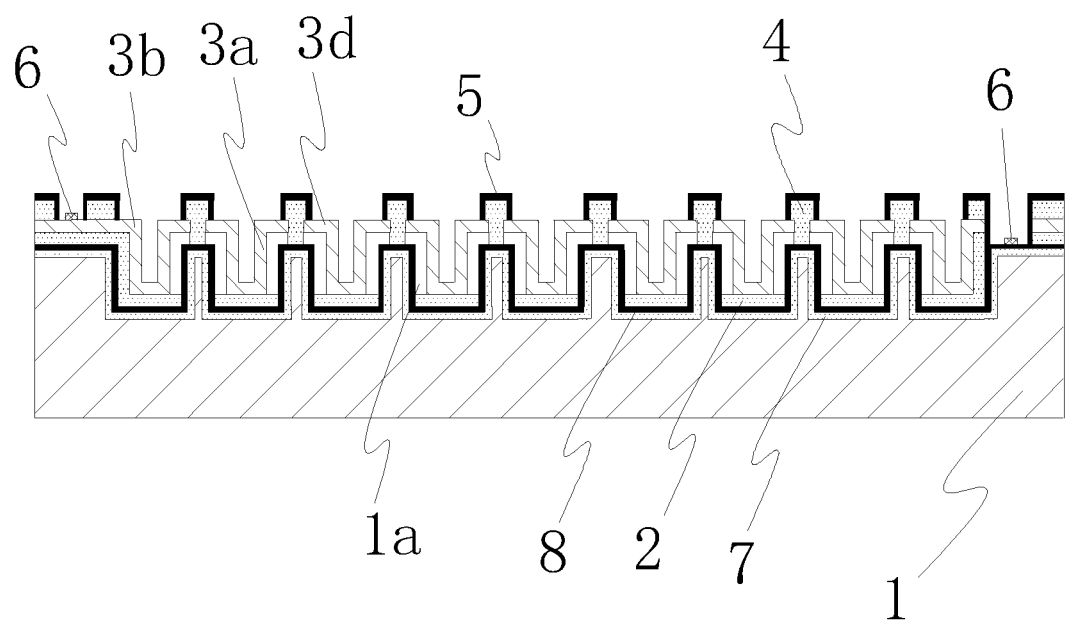
FIG. 11 is a structural schematic diagram of anther embodiment of an environmental sensor according to the present invention.

In the above embodiment, the capacitor structure of the environmental sensor is formed by the bending parts 3a of the sensitive film layer and the side walls of the grooves 1a. In another specific embodiment of the present invention, referring to FIG. 11, a fixed film layer 8 is at least disposed on the side walls of the grooves 1a of the base material 1. The fixed film layer 8 and the side walls of the bending parts 3a of the sensitive film layer 3 form a capacitor structure for signal detection. The base material 1 may adopt a mono-crystal silicon material. The fixed film layer 8 and the sensitive film layer 3 may both adopt the polycrystalline silicon material. In order to insure the insulation between the fixed film layer 8 and the base material 1, a third insulating layer 7 is disposed between the fixed film layer 8 and the size walls of the grooves 1a. Same as the above first insulating layer 2, the third insulating layer 7 may adopt the silicon dioxide material.

The third insulating layer 7 and the fixed film layer 8 may be only disposed on the side walls of the grooves 1a and may also extend to the whole upper end surface of the base 1. For example, the third insulating layer 7 and the fixed film layer 8 are formed on the upper end of the base material 1 in sequence in a manner of depositing or the like. The shapes of the third insulating layer 7 and the fixed film layer 8 are matched with the shape of the whole upper end of the base material 1. That is to say, in the positions of the grooves 1a, the third insulating layer 7 and the fixed film layer 8 extend along the inner walls of the grooves 1a and present a shape matched with the grooves 1a. When the outside environment is changed (for example the pressure is changed), the bending parts 3a will be deformed accordingly, thereby changing the distance between the bending parts 3a and the side wall of the fixed film layer 8 and causing the signal output by the capacitor to be changed.

Figure 2:
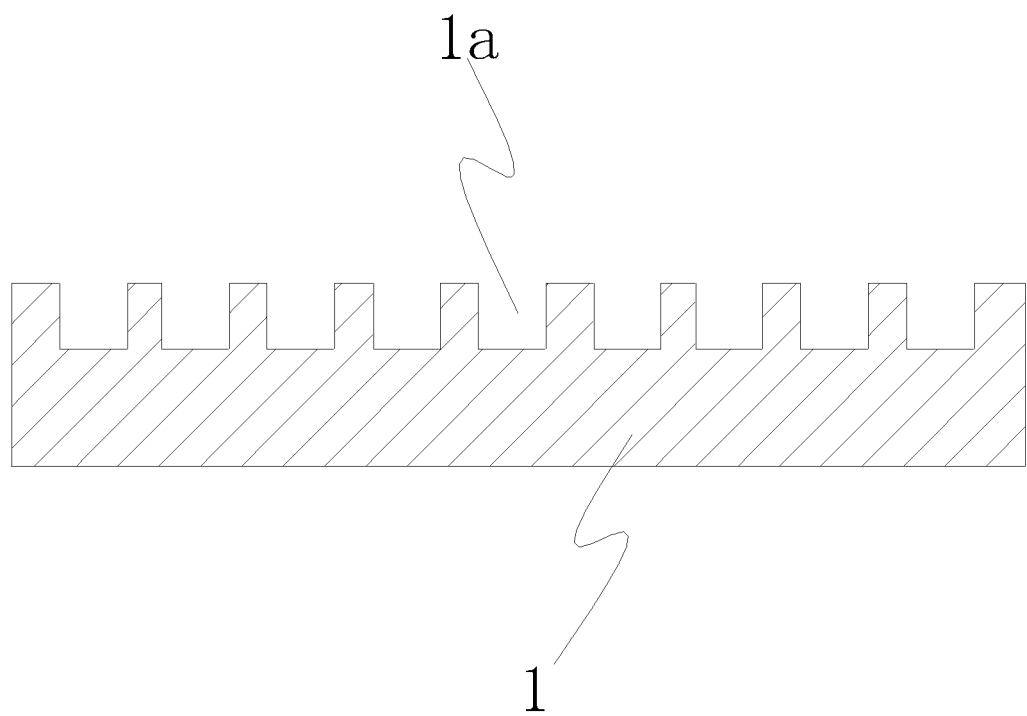
FIGS. 2 to 10 are process flowcharts of a manufacturing method for an environmental sensor according to the present invention.
Figure 3:
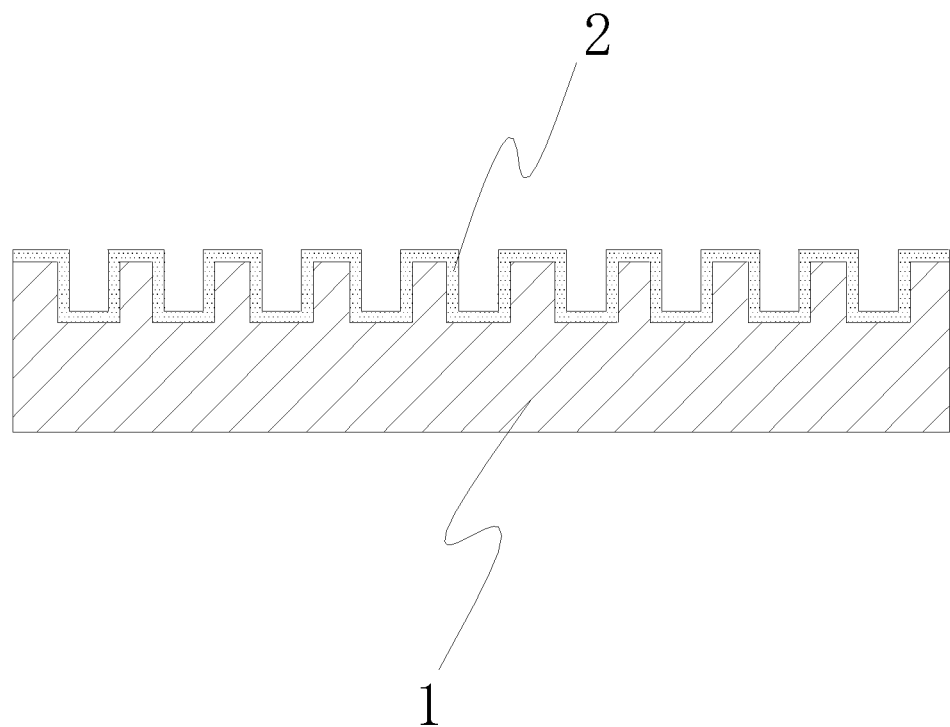

The present invention further provides a manufacturing method for an environmental sensor, which comprises the following steps.

a) Firstly, a plurality of grooves 1a is etched in the upper end surface of a base material 1, referring to FIG. 2. A first sacrificial layer 2 is deposited on the upper end surface of the base material 1 and the inner walls of the grooves 1a, referring to FIG. 3. The base material 1 may adopt a mono-crystal silicon material. The shape of the grooves 1a is selected according to actual needs. For example, a U-shaped groove structure, an arc groove structure, or the like are adopted. The first sacrificial layer 2 is deposited on the upper end surface of the whole base material 1, and its shape is matched with the shape of the whole upper end of the base material 1.

Figure 4:
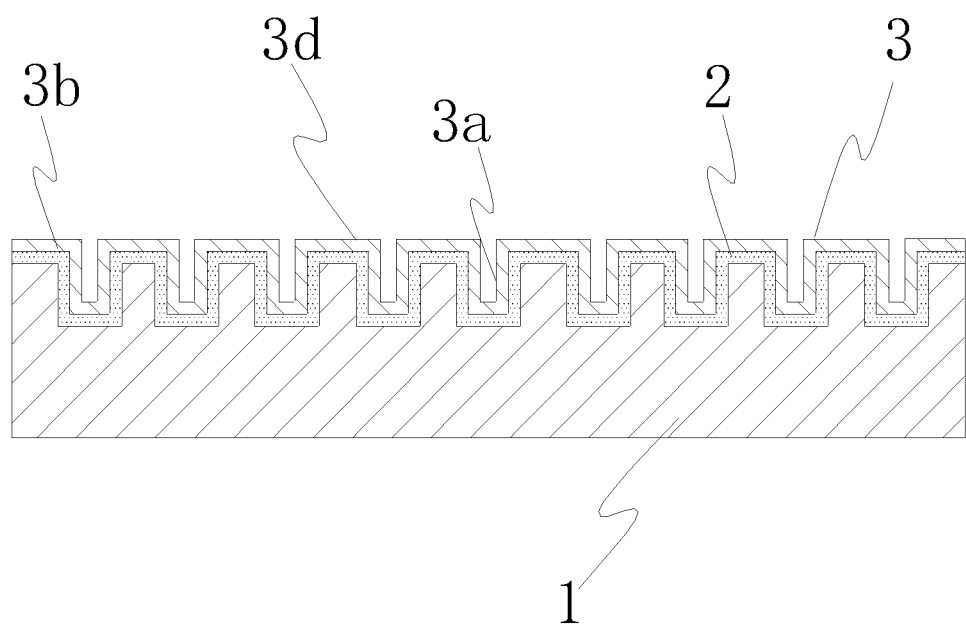
Figure 6:
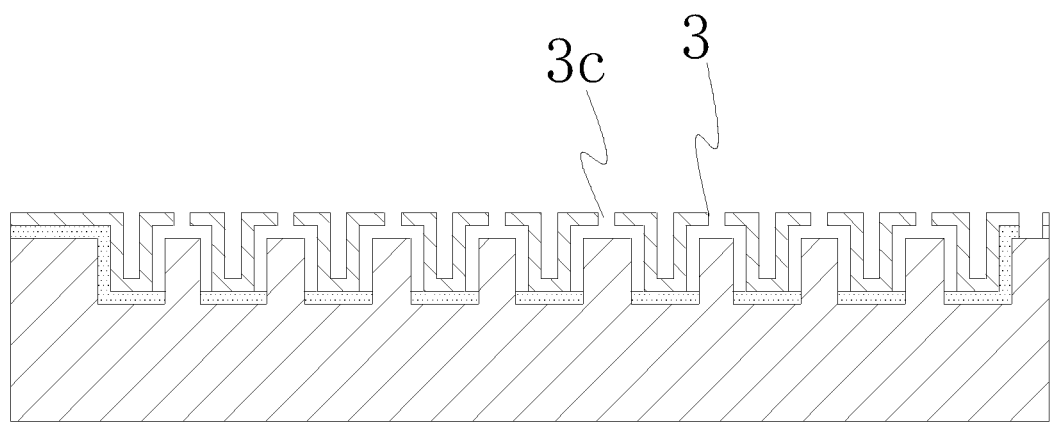

It should be noted here that the sacrificial layer may adopt a material well known by those skilled in the art, such as silicon oxide. The sacrificial layer may also be used as an insulating layer to ensure insulation among the parts, which belongs to common general knowledge of those skilled in the art and is not explained specifically here.

b) A sensitive film layer 3 is deposited on the first sacrificial layer 2. The sensitive film layer 3 comprises a fixed part 3b fixed on the end surface of the base material 1 and a bending part 3a extending into the groove 1a. When a plurality of grooves 1a is disposed, the sensitive film layer 3 further comprises a connecting part 3d connected to two adjacent bending parts 3a, referring to FIG. 4. The sensitive film layer 3 may adopt a polycrystalline silicon material, is deposited on the upper end of the first sacrificial layer 2 and its shape is matched with the shape of the whole end surface of the first sacrificial layer 2.

c) The sensitive film layer 3 on the end surface of the base material 1 is etched to form hollows 3c, referring to FIG. 5. Specifically, the hollows 3c are disposed in the connecting 3d. It should be noted here that the hollows 3c may serve as corroding holes to corrode the first sacrificial layer 2. Meanwhile, the two adjacent bending parts 3a may be isolated from each other by the hollow 3c according to actual design needs. For example, when a plurality of groups of capacitor structures needs to be formed on the base material 1, that is to say, when some adjacent bending parts 3a need to be insulated from each other, the hollow 3c may be disposed to penetrate the two ends of the connecting parts 3d, thereby disconnecting the two adjacent bending parts 3a completely.

d) The first sacrificial layer 2 located between the bending parts 3a and the side walls of the grooves 1a is at least corroded by the hollows 3c, referring to FIG. 6. The first sacrificial layer 2 may be corroded by hydrofluoric acid, which belongs to common general knowledge of those skilled in the art, and is not specifically explained here.

In one specific embodiment of the present invention, by corroding, the first sacrificial layer 2 between the bending parts 3a and the side walls of the grooves 1a are corroded, and the first sacrificial layer 2 between the bending parts 3a and the bottom ends of the grooves 1a are reserved. Therefore, the bottom ends of the bending parts 3a are fixed on the bottom ends of the grooves 1a by the first sacrificial layer 2. That is to say, the bottom ends of the bending parts 3a are connected on the bottom ends of the grooves 1a by the first sacrificial layer 2. The side walls of the bending parts 3a and the side walls of the grooves 1a form a capacitor structure of the environmental sensor.

In another specific embodiment of the present invention, the first sacrificial layer 2 between the bending parts 3a and the grooves 1a is corroded completely by the hollows 3c, such that there is no any connection relationship between the bending parts 3a and the grooves 1a. That is to say, the bending parts 3a are suspended in the grooves 1a of the base material 1. Therefore, the sensitivity of the bending parts 3a is improved, and it is favorable to improve the detection precision of the capacitor structure.

Further, preferably, the first sacrificial layer 2 below the connecting parts 3d is also corroded, such that the connecting parts 3d are suspended on the end surface of the base material 1. The sensitivity of the bending parts 3a connected thereto is improved. The detection precision of the capacitor structure is further improved.

e) A second sacrificial layer 4 is deposited on the sensitive film layer 3. The second sacrificial layer 4 seals the hollows 3c, referring to FIG. 7.

f) The second sacrificial layer 4 located on the bending parts 3a is corroded. Therefore, the bending parts 3a are exposed, and the bending parts 3a can sense the change of the outside environment. Finally, the environmental sensor according to the present invention is formed, referring to FIG. 1.

Figure 8:
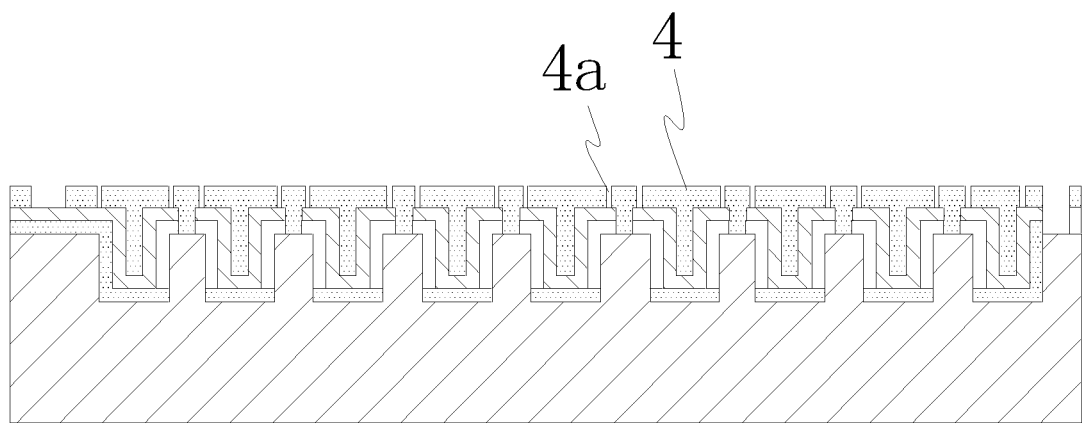
Figure 9:
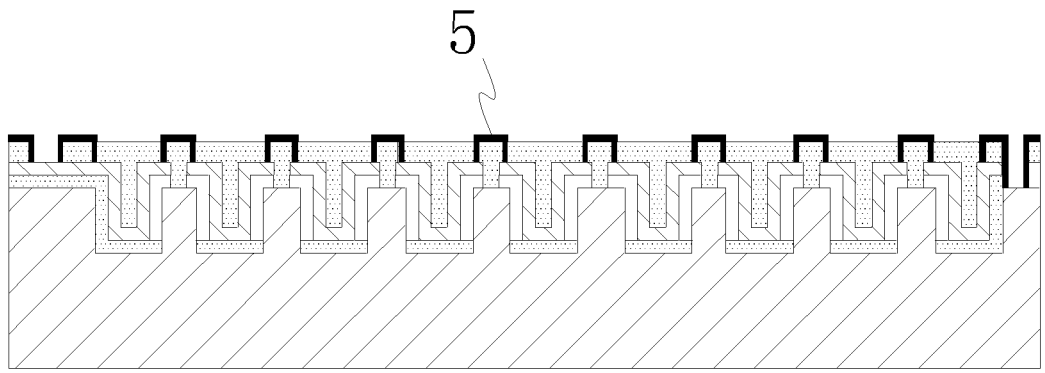

In one preferred embodiment of the present invention, between the step e) and the step f), the manufacturing method further comprises the following step: etching the positions on the second sacrificial layer 4 on both sides of the hollows to form side wall grooves 4a, referring to FIG. 8. A protective layer 5 is deposited on the upper end of the second sacrificial layer 4. The protective layer 5 is also filled in the side wall grooves 4a. Afterwards, the protective layer 5 is subjected to pattern etching, referring to FIG. 9. The protective layer 5 may adopt a silicon nitride material, and is disposed in hollow positions by the manners of depositing, etching or the like well known by those skilled in the art.

Figure 10:
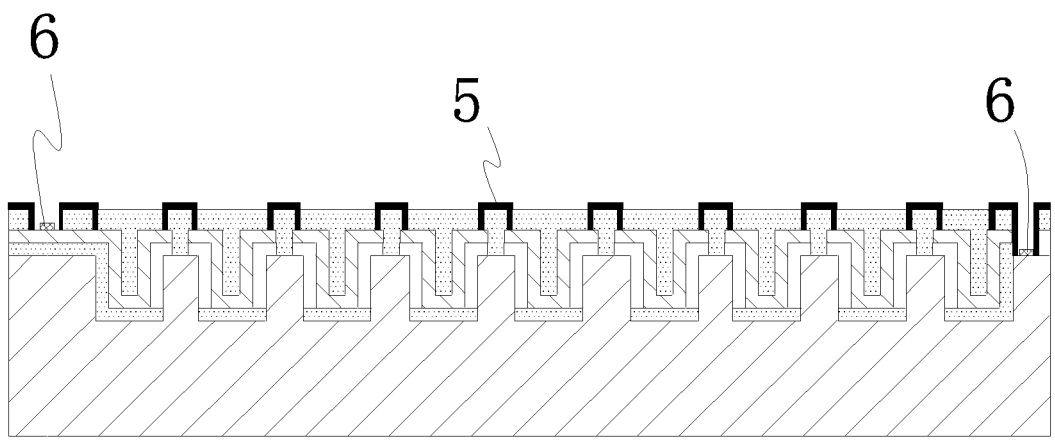

According to the present invention, further preferably, between the step e) and the step f), the method further comprises the step of depositing metal electrodes 6 on the base material 1 and the sensitive film layer 3. The metal electrodes 6 may serve as two welding spots of a capacitor lead, so as to lead a signal of the capacitor out, referring to FIG. 10.

According to the present invention, in order to obtain the environmental sensor formed by the bending parts 3a and the fixed film layer 8, before depositing the first sacrificial layer 2 in the step a), the manufacturing method further comprises the step of depositing a third sacrificial layer 7 and the fixed film layer 8 on at least the inner walls of the grooves 1a in sequence. By this step, the fixed film layer 8 is fixed on the inner walls of the grooves 1a of the base material 1. The bending parts 3a of the sensitive film layer 3 are formed by the subsequent steps. Therefore, the bending parts 3a and the fixed film layer 3 form the capacitor structure configured to detect the change of an electric signal.

The environmental sensor and the manufacturing method therefor according to the present invention also comprise a housing for encapsulation (not shown). The housing may be fixed on the base material 1 and encapsulates the capacitor structure of an MEMS environmental sensor. Correspondingly, communicating holes for communicating bending parts of the MEMS environmental sensor with the outside are further disposed, which belongs to the common general knowledge of those skilled in the art and is not specifically explained here.

Although specific embodiments of the present invention are described in detail some examples, those skilled in the art shall understand that the above examples are illustrative only and are not intended to limit the scope of the present invention, that modifications can be made to the above embodiments without departing from the scope and spirit of the present invention, and that the scope of the present invention is defined by the appended claims.

The invention claimed is:

1. An environmental sensor comprising:
   a base material (1), wherein the upper end of the base material (1) is provided with at least one groove (1a); and
   a sensitive film layer (3) on the base material (1), the sensitive film layer (3) comprises a fixed part (3b) fixed on the end surface of the base material (1) and a bending part (3a) extending into the groove (1a), the bending part (3a) and the side wall of the groove (1a) form a capacitor configured for signal detection;
   wherein:
      the bending part (3a), the fixed part (3b) and the groove (1a) form an airtight cavity, and
      the sensitive film layer (3) further comprises a connecting part (3d) connected to two adjacent bending parts (3a), and the connecting part (3d) is suspended above the end surface of the base material (1).

2. The environmental sensor according to claim 1, wherein the bending part (3a) is suspended in the groove (1a).

3. The environmental sensor according to claim 1, wherein the bottom end of the bending part (3a) is fixed on the bottom end of the groove (1a) by a first sacrificial layer (2).

4. The environmental sensor according to claim 1, wherein the connecting part (3d) is further provided with a hollow (3c), and the two adjacent bending parts (3a) are insulated by the hollow (3c); and the environmental sensor further comprises a second sacrificial layer (4) filling the hollow (3c).

5. An environmental sensor comprising:
   a base material (1), wherein the upper end of the base material (1) is provided with at least one groove (1a);
   a fixed film layer (8) at least disposed on the side wall of the groove (1a) of the base material (1) by an insulating layer; and
   a sensitive film layer (3) on the base material (1), the sensitive film layer (3) comprises a fixed part (3b) fixed on the end surface of the base material (1) and a bending part (3a) extending into the groove (1a), the bending part (3a) and the side wall of the fixed film layer (8) form a capacitor configured for signal detection;
   wherein:
      the bending part (3a), the fixed part (3b) and the groove (1a) form an airtight cavity, and
      the sensitive film layer (3) further comprises a connecting part (3d) connected to two adjacent bending parts (3a), and the connecting part (3d) is suspended above the end surface of the base material (1).

6. The environmental sensor according to claim 5, wherein the bending part (3a) is suspended in the groove (1a).

7. The environmental sensor according to claim 5, wherein the bottom end of the bending part (3a) is fixed on the bottom end of the groove (1a) by a first sacrificial layer (2).

8. The environmental sensor according to claim 5, wherein the connecting part (3d) is further provided with a hollow (3c), the two adjacent bending parts (3a) are insulated by the hollow (3c), and the environmental sensor further comprises a second sacrificial layer (4) filling the hollow (3c).

9. A manufacturing method for an environmental sensor, the method comprising:
  a) etching a groove (1a) in the upper end surface of a base material (1), and depositing a first sacrificial layer (2) on the upper end surface of the base material (1) and the inner wall of the groove (1a);
  b) depositing a sensitive film layer (3) on the first sacrificial layer (2), wherein the sensitive film layer (3) comprises a fixed part (3b) fixed on the end surface of the base material (1) and a bending part (3a) extending into the groove (1a);
  c) etching the sensitive film layer (3) on the end surface of the base material (1) to form a hollow (3c);
  d) at least corroding the first sacrificial layer (2) located between the bending part (3a) and the side wall of the groove (1a) by the hollow (3c);
  e) depositing a second sacrificial layer (4) on the sensitive film layer (3), wherein the second sacrificial layer (4) seals the hollow (3c); and
  f) corroding the second sacrificial layer (4) located on the bending part (3a).

10. The manufacturing method according to claim 9, wherein, between the step e) and the step f), the method further comprises etching the positions on the second sacrificial layer (4) on both sides of the hollow (3c) to form a side wall groove (4a), and depositing a protective layer (5) on the upper end of the second sacrificial layer (4), wherein the protective layer (5) is filled in the side wall groove (4a).

11. The manufacturing method according to claim 9, wherein in the step d), the first sacrificial layer (2) between the bending part (3a) and the groove (1a) is completely corroded, such that the bending part (3a) is suspended in the groove (1a).

12. The manufacturing method according to claim 9, wherein, before the first sacrificial layer (2) is deposited in the step a), the method further comprises depositing a third sacrificial layer (7) and a fixed film layer (8) on the inner wall of the groove (1a) in sequence.

13. The manufacturing method according to claim 9, wherein the bending part (3a) comprises at least two bending parts (3a), the sensitive film layer (3) further comprises a connecting part (3d) connected to two adjacent of the bending parts (3a), and the connecting part (3d) is suspended above the end surface of the base material (1).

14. The manufacturing method according to claim 13, wherein the two adjacent bending parts (3a) are insulated by the hollow (3c).

* * * * *